United States Patent
Köhler et al.

(10) Patent No.: US 10,519,559 B2
(45) Date of Patent: Dec. 31, 2019

(54) METHOD FOR IMPROVING THE WELDABILITY OF HIGH MANGANESE CONTENT STEEL STRIPS

(71) Applicant: SALZGITTER FLACHSTAHL GMBH, Salzgitter (DE)

(72) Inventors: Kai Köhler, Hannover (DE); Marc Debeaux, Braunschweig (DE); Friedrich Luther, Hannover (DE)

(73) Assignee: SALZGETTER FLACHSTAHL GMBH, Salzgitter (DE)

( * ) Notice: Subject to any disclaimer, the term of this patent is extended or adjusted under 35 U.S.C. 154(b) by 211 days.

(21) Appl. No.: 14/777,868

(22) PCT Filed: Mar. 12, 2014

(86) PCT No.: PCT/DE2014/000140
§ 371 (c)(1),
(2) Date: Sep. 17, 2015

(87) PCT Pub. No.: WO2014/146638
PCT Pub. Date: Sep. 25, 2014

(65) Prior Publication Data
US 2016/0281252 A1      Sep. 29, 2016

(30) Foreign Application Priority Data
Mar. 21, 2013   (DE) .................. 10 2013 005 301

(51) Int. Cl.
*C25D 7/06*      (2006.01)
*C25D 5/10*      (2006.01)
(Continued)

(52) U.S. Cl.
CPC ............ *C25D 5/10* (2013.01); *C22C 38/02* (2013.01); *C22C 38/04* (2013.01); *C22C 38/06* (2013.01);
(Continued)

(58) Field of Classification Search
CPC ......... C22C 38/04; C22C 38/06; C22C 38/24; C22C 38/02; C22C 38/16; C22C 38/18;
(Continued)

(56) References Cited

U.S. PATENT DOCUMENTS 4,524,111 A     6/1985   Oka et al.
5,043,230 A *   8/1991   Jagannathan ......... B32B 15/013
                                                    428/655
(Continued)

FOREIGN PATENT DOCUMENTS

DE        199 00 199 A1      7/2000
DE    10 2004 061 284 A1     7/2005
(Continued)

OTHER PUBLICATIONS

Machine Translation, Yasushi et al., JP 08-060342, Mar. 1996.*
(Continued)

*Primary Examiner* — Michael E. La Villa
(74) *Attorney, Agent, or Firm* — Henry M. Feiereisen LLC

(57) ABSTRACT

In a method for improving the weldability of high-manganese-containing steel strips which contain (in % by weight) from 6 to 30% of manganese, up to 1% of carbon, up to 15% of aluminum, up to 6% of silicon, up to 6.5% of chromium, up to 4% of copper and also total additions of titanium and zirconium of up to 0.7% and total additions of niobium and vanadium of up to 0.5%, balance iron including unavoidable steel-accompanying elements the steel strips are coated with a zinc-containing corrosion protection layer.

4 Claims, 1 Drawing Sheet

(51) Int. Cl.
| | |
|---|---|
| C25D 3/22 | (2006.01) |
| C22C 38/38 | (2006.01) |
| C22C 38/34 | (2006.01) |
| C22C 38/06 | (2006.01) |
| C22C 38/28 | (2006.01) |
| C22C 38/26 | (2006.01) |
| C22C 38/24 | (2006.01) |
| C22C 38/20 | (2006.01) |
| C23C 2/02 | (2006.01) |
| C23C 2/06 | (2006.01) |
| C22C 38/02 | (2006.01) |
| C22C 38/14 | (2006.01) |
| C23C 16/06 | (2006.01) |
| C23C 14/00 | (2006.01) |
| C23C 28/02 | (2006.01) |
| C22C 38/12 | (2006.01) |
| C23C 14/14 | (2006.01) |
| C23C 14/16 | (2006.01) |
| C23C 2/12 | (2006.01) |
| C23C 2/40 | (2006.01) |
| C22C 38/04 | (2006.01) |
| C22C 38/16 | (2006.01) |
| C22C 38/18 | (2006.01) |
| C23C 30/00 | (2006.01) |

(52) U.S. Cl.
CPC .............. *C22C 38/12* (2013.01); *C22C 38/14* (2013.01); *C22C 38/16* (2013.01); *C22C 38/18* (2013.01); *C22C 38/20* (2013.01); *C22C 38/24* (2013.01); *C22C 38/26* (2013.01); *C22C 38/28* (2013.01); *C22C 38/34* (2013.01); *C22C 38/38* (2013.01); *C23C 2/02* (2013.01); *C23C 2/06* (2013.01); *C23C 2/12* (2013.01); *C23C 2/40* (2013.01); *C23C 14/00* (2013.01); *C23C 14/14* (2013.01); *C23C 14/16* (2013.01); *C23C 16/06* (2013.01); *C23C 28/02* (2013.01); *C23C 28/021* (2013.01); *C23C 28/023* (2013.01); *C23C 30/00* (2013.01); *C25D 3/22* (2013.01); *C25D 7/0614* (2013.01)

(58) Field of Classification Search
CPC ......... C22C 38/20; C22C 38/12; C22C 38/38; C22C 38/34; C22C 38/28; C22C 38/14; C22C 38/26; C23C 28/02; C23C 30/00; C23C 2/02; C23C 2/06; C23C 28/021; C23C 2/12; C23C 2/40; C23C 14/00; C23C 14/14; C23C 14/16; C23C 16/06; C23C 28/023; C23C 30/005; Y10T 428/12792; Y10T 428/12799; Y10T 428/12979; Y10T 428/2495; Y10T 428/24967; Y10T 428/24975; Y10T 428/263; Y10T 428/264; Y10T 428/265; Y10T 428/1275; B32B 15/013; B32B 15/04; B32B 15/043; B32B 15/18
See application file for complete search history.

(56) References Cited

U.S. PATENT DOCUMENTS

| | | |
|---|---|---|
| 2008/0083477 A1 | 4/2008 | Drillet et al. |
| 2008/0271823 A1 | 11/2008 | Hofmann et al. |
| 2009/0202382 A1 | 8/2009 | Kim et al. |

FOREIGN PATENT DOCUMENTS

| | | |
|---|---|---|
| DE | 10 2005 008 410 B3 | 2/2006 |
| DE | 10 2006 039 307 B3 | 2/2008 |
| DE | 10 2008 005 605 A1 | 7/2009 |
| DE | 10 2009 053 260 A1 | 5/2011 |
| JP | 60-082690 A * | 5/1985 |
| JP | H08 60342 A | 3/1996 |
| WO | WO 2007/074994 A1 | 7/2007 |
| WO | WO 2007/075006 A1 | 7/2007 |
| WO | WO 2009/084793 A1 | 7/2009 |

OTHER PUBLICATIONS

Machine Translation, Ataya et al., JP 60-082690, May 1985. (Year: 1985).*
International Search Report issued by the European Patent Office in international Application PCT/DE2014/000140.

* cited by examiner

METHOD FOR IMPROVING THE WELDABILITY OF HIGH MANGANESE CONTENT STEEL STRIPS

CROSS-REFERENCES TO RELATED APPLICATIONS

This application is the U.S. National Stage of International Application No. PCT/DE2014/000140, filed Mar. 12, 2014, which designated the United States and has been published as International Publication No. WO 2014/146638 and which claims the priority of German Patent Application, Serial No. 10 2013 005 301.3, filed Mar. 21, 2013, pursuant to 35 U.S.C. 119(a)-(d).

BACKGROUND OF THE INVENTION

The invention relates to a method for improving the weldability of high-manganese-content, zinc coated steel strips which (in weight %) beside 6 to 30% manganese can contain up to 1% carbon, up to 15% aluminum, up to 6% silicone, up to 6.5% chromium, up to 4% copper and a content of titanium and zirconium in sum of up to 0.7% and a content of niobium and vanadium in sum of up to 0.5%, remainder iron and unavoidable steel tramp elements.

Due to their favorable elongation and strength properties, steels with high contents of manganese, aluminum and/or silicone, also known as HSD®-steels (High Strength and Ductility), are suited for the construction of transport vehicles, in particular for the automobile construction.

High-manganese-content steels (for example HSD®-steels) compared to conventional steels are characterized by a significantly lower specific weight, which contributes to a significant weight reduction when using these lightweight steels in the vehicle body construction.

Steels with high manganese content from 7 to 27 weight % are for example known from DE 199 00 199 A1 and steels with 9 to 30 weight % manganese are known from DE 10 2004 061 284 A1. Flat products made of these steels have high strengths and at the same time a high uniform elongation.

However, steels with higher manganese contents have a propensity of pitting and surface corrosion and without the addition of aluminum and/or silicone have a lower resistance against hydrogen-induced stress corrosion. It has therefore been proposed to also coat flat products made of high-manganese-content steels in a known manner with a metallic coating that protects the steel against corrosion.

When corresponding demands are placed on the corrosion resistance it is known to coat the high-manganese-content steel strip with an anticorrosion layer of zinc or a zinc alloy.

High-manganese-content steel strips may be in a cold rolled or hot rolled state, wherein the zinc or zinc alloy layer is generally applied eletrolytically or by hot dip galvanization.

From DE 199 00 199 A1 it is known to enrich and/or coat the surface of the flat product with aluminum. In WO 2007/075006 A1 a high-manganese-content steel is proposed, wherein the flat product produced from this steel in a known manner is coated electroytically or by hot dip galvanization with a zinc layer after the last final annealing.

An unsolved problem in many of the known high-manganese-content steels is still however that they are insufficiently weldable when galvanized, which is characterized by the occurrence of liquid metal induced crack formation in the welding zone of the material.

In the following, the term welding is understood to include all resistance-welding methods, fusion-welding methods or beam-welding methods in which beside the basic material the zinc coating is liquefied.

As a result of the heat influence during the welding, liquefied zinc from the coating infiltrates the grain boundaries. This infiltration causes the basic material to lose its strength and ductility in the vicinity of the welding zone to the degree that the welding connection or the basic material bordering the welding connection no longer meets the required mechanical demands and the risk of a premature failure of the welding connection due to crack formation increases. This form of stress corrosion is referred to as Liquid Metal Embrittlement (LME) because the corrosive medium in this case is a liquid metal.

For improving the weldability of hot dip galvanized high-manganese-content lightweight steels DE 10 2005 008 410 B3 purposes to apply an aluminum layer by means of PVD (Physical Vapor Deposition) to the cold strip prior to the final annealing. Onto this the anticorrosion coating is applied after the final annealing. The Al/Fe-diffusion layer formed as a result of the heat treatment is intended to prevent the entering of the molten zinc into the basic material during the welding and with this liquid metal embrittlement. However, a disadvantage is the high costs of this process.

For avoiding a liquid metal induced crack formation of high-manganese-content galvanized steels DE 10 2009 053 260 A1 proposes an annealing treatment in an $N_2/H_2$ containing atmosphere, which leads to a formation of aluminum nitrides on the steel surface. These surface-proximate aluminum layers are intended to prevent the entering of zinc into the material and with this embrittlement. A disadvantage is here the required high nitriding temperatures, which may lead to impaired mechanical properties of the basic material.

SUMMARY OF THE INVENTION

Based on the explained state of the art it is an object of the invention to provide an alternative and cost-effective method with which it is possible on one hand to effectively protect the high-manganese-content steel against corrosion and on the other hand to avoid the problem of the liquid metal induced crack formation during welding, while avoiding the disadvantages of the known methods. In addition a correspondingly coated steel sheet is provided.

With regard to the method the object is solved in that steel strips, containing (in weight %) 6 to 30% manganese, up to 1% carbon, up to 15% aluminum, up to 6% silicone, up to 6.5% chromium, up to 4% copper, and titanium and zirconium in sum of up to 0.7% and niobium and vanadium or in sum of up to 0.5%, remainder iron including unavoidable steel tramp elements, which are coated with a zinc containing corrosion protection layer, which is characterized in that for preventing a liquid metal embrittlement of the steel strip during welding an alloy of zinc/manganese, zinc/cobalt or zinc/iron is applied onto the steel strip as zinc containing anticorrosion layer.

Advantageously the steels strips (hot or cold strip) have a carbon content of at least (in weight %) 0.04% and a silicone and aluminum content of at least respectively 0.05%, in order to realize on one hand, an increased resistance against hydrogen-induced stress corrosion and on the other hand, as a result of the interaction between manganese, carbon, silicone and aluminum inhibit a deformation-induced martensite formation and the strengthening associated therewith.

Surprisingly, tests have shown that coating the material with a layer that beside zinc also contains manganese, cobalt or iron, not only provides excellent protection against corrosion but also has a particularly positive effect on the prevention of liquid metal embrittlement. In the following, this variant is referred to as single-layer variant.

In addition it has been shown that liquid metal induced crack formation is also effectively prevented when a zinc-based layer is applied as a second layer onto a first thin layer of zinc/manganese, zinc/cobalt, or zindiron that has been applied onto the steel strip beforehand. In the following this variant is referred to as multi-layer variant. According to the invention the zinc-containing anticorrosion layer thus functions in particular as a barrier layer, while the actual cathodic corrosion protection is provided by the second zinc-based layer.

The embrittlement inhibiting effect of the zinc-containing anticorrosion layer that is applied onto the steel strip according to the invention can be attributed on one hand to the formation of surface-proximate oxidation products during the joining process (for example the formation of manganese oxides in the case of zinc/manganese alloys). This has the effect of blocking diffusion pathways for zinc at the grain boundaries, which prevents the entering of zinc and thus embrittlement of the material.

On the other hand the addition of manganese, cobalt or iron to the zinc layer increases the melting point of the layers, which reduces the melting of the coating during the joining process.

For ensuring a sufficient corrosion protection while at the same time inhibiting liquid metal embrittlement it is provided according to the invention that in the single layer and also in the multi-layer variant the proportion of the respective alloy element (in weight %) in the zinc-containing anticorrosion layer is at least 1%. Advantageous are respective minimal contents of 5 to 25% in order to achieve a significant improvement of the weldabilty. If necessary the contents can be increased to 50% or more.

In the single layer embodiment, the thickness of the coating can be between 0.5 μm and 50 μm depending on the requirements placed on the corrosion protection. In the case of electrolytic galvanization, layer thicknesses of 1-12 μm were shown to be advantageous and in the case of hot dip galvanization layer thicknesses of 5 to 35 μm.

In the case of the multi-layer variant, the zinc-containing anticorrosion layer that is directly applied onto the steel substrate is made of a 0.1 to 5 μm thick layer, which beside zinc also contains manganese, cobalt or iron, and which functions as a diffusion barrier, and a second zinc based layer applied onto the zinc-containing anticorrosion layer, which essentially ensures the cathodic protection against corrosion. In the case of a zinc alloy as second layer, this layer can contain beside zinc as main element the further elements aluminum and/or silicone and/or magnesium and/or iron in order to meet customer demands regarding appearance of the surface, varnishing capability, corrosion protection etc.

The thickness of this second layer can be between 0.5 um and 50 μm, depending on the requirements.

In the single layer variant and the multi layer embodiment, the high-manganese-content steel strip according to the invention is preferably coated electrolytically; however it is also possible to applied the coating with alternative methods, such as by precipitation from a gas phase.

The method according to the invention can also be used for coating hot or cold rolled steel strips.

The advantages of the method according to the invention are on one hand a significantly increased resistance against a liquid metal induced crack formation compared to a high-manganese-steel that is only coated with zinc. On the other hand in the case of the single- or multi-layer variant, the application of the coatings according to the invention can be realized cost-effectively with known and available industrial-scale aggregates by electrolysis, or by means of alternative methods such as precipitation from a gas phase (for example PVD).

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

On a strip casting system known from DE 10 2004 061 284 A1, a steel of the composition X70Mn—Al—Si-15-1.5-2.5, remainder iron including unavoidable steel tramp elements was cast to a thin strip and then rolled to a hot strip. Subsequently the hot strip was pickled in a conventional manner, cold rolled and annealed. After this, the strip was cleaned and subjected to an activation of the surface (descaling), before it was electrolytically coated with a zinc-containing anticorrosion layer according to the invention and a zinc-based second layer (multi-layer variant).

The zinc-containing anticorrosion layers applied onto the steel strip had in respective 12 samples a zinc/manganese ratio (in weight %) of 77123, 64/36, 30/70 and 40/60 and in respective 5 samples a zinc/cobalt ratio (in weight %) of 28/72, 89/11 and 91/9. The layer thicknesses in the single-layer variant were between 1 and 5 μm. In the multi layer embodiment the thickness of the first layer was between 0.5 and 1 μm and the thickness of the second layer between 1 and 4 μm. For testing the sensitivity against liquid metal induced crack formation the samples were joined in the resistance point welding process.

All 48 samples with zinc/manganese layers and also all 15 welding samples with zinc/cobalt layers were crack-free. The results of the welding tests are also summarized in tables 1 and 2. Similarly good results were also observed for the zindiron layers according to the invention.

Figure 1:
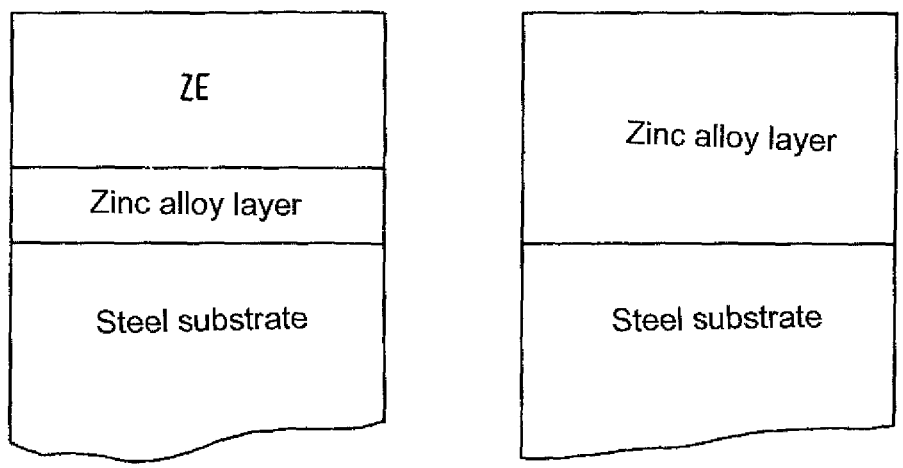
FIG. 1 is a schematic representation of an embodiment according to the invention with a multi-layer configuration of the anticorrosion layer.

FIG. 1 schematically shows in the left-hand partial image an embodiment according to the invention with a multi-layer configuration of the anticorrosion layer. A first zinc-containing anticorrosion layer was electrolytically applied onto the high-manganese-content steel substrate and subsequently a second layer of zinc (ZE) was electrolytically applied. In this embodiment the thickness of the zinc-containing anticorrosion layer can be between 0.1 μm and 50 μm, whereas the thickness of the zinc-based layer can be between 0.5 μm and 50 μm.

The right-hand partial image in FIG. 1 shows a second embodiment with a single layer construction. In such a construction a zinc-containing anticorrosion layer with a thickness between 0.5 µm and 50 µm is applied onto the high-manganese-content steel substrate.

Figure 2:
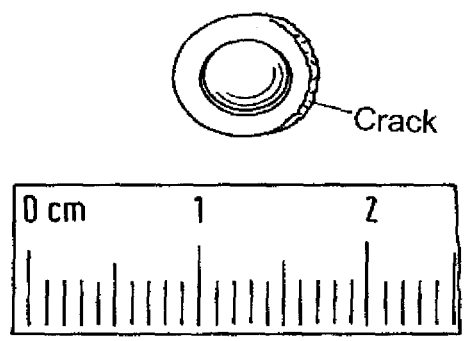
FIG. 2 shows a conventional zinc-coated high-manganese-content steel sample.
Figure 3:
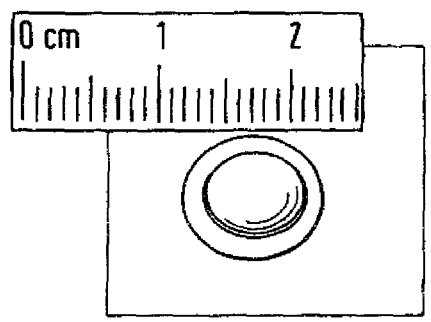
FIG. 3 shows a high-manganese-content steel sample according to the invention.

FIGS. 2 and 3 show images of resistance point welded samples.

FIG. 2 shows a conventional zinc-coated (ZE) high-manganese-content steel sample, which was joined by resistance point welding. The thickness of the zinc layer is about 3.5 µm. This sample shows a liquid metal induced crack in the heat influence zone.

FIG. 3 shows a high-manganese-content steel sample, which was electrolytically coated with a zinc alloy coating with a thickness of 2 µm and containing 23 weight % manganese and was subsequently joined by resistance point welding. The sample is completely free of cracks.

TABLE 1 results of welding tests on steel sheets with zinc/manganese anticorrosion coatings of different compositions.

| | Zn/Mn ratio [weight %] | | | |
|---|---|---|---|---|
| Cracks in welding sample | 77/23 | 64/36 | 30/70 | 40/60 |
| 1 | No | No | No | No |
| 2 | No | No | No | No |
| 3 | No | No | No | No |
| 4 | No | No | No | No |
| 5 | No | No | No | No |
| 6 | No | No | No | No |
| 7 | No | No | No | No |
| 8 | No | No | No | No |
| 9 | No | No | No | No |
| 10 | No | No | No | No |
| 11 | No | No | No | No |
| 12 | No | No | no | No |

TABLE 2 results of welding tests on steel sheets with zinc/cobalt anticorrosion coatings of different compositions

| | Zn/Co ratio in the alloy [weight %] | | |
|---|---|---|---|
| Crack in welding sample | 28/72 | 89/11 | 91/9 |
| 1 | No | No | No |
| 2 | No | No | No |
| 3 | No | No | No |
| 4 | No | No | No |
| 5 | No | No | No |

The invention claimed is:

1. A method for improving the weldability of high manganese content steel strips, comprising:
    providing a steel strip containing (in weight %) 6 to 30% manganese, including from 0% and 1% carbon, including from 0% and 15% aluminum, including from 0% and 6% silicon, including from 0% and 6.5% chromium, including from 0% and 4% copper, and additions of both pairs of titanium and zirconium including from 0% and 0.7% and both pairs of niobium and vanadium including from 0% and 0.5%, remainder iron including unavoidable steel impurity elements;
    coating the steel strip with a first zinc-containing anticorrosion layer electrolytically or by hot dipping, by applying a composition which consists of a hi-component alloy selected from the group consisting of zinc/manganese, zinc/cobalt and zinc/iron, for preventing a liquid metal embrittlement during welding; and
    subsequently applying a second zinc-containing layer with a thickness between 0.5 µm and 50 µm only electrolytically onto an already formed first zinc-containing anticorrosion layer consisting of a bi-component alloy selected from the group consisting of zinc/manganese, zinc/cobalt and zinc/iron,
    wherein the zinc content of the first zinc-containing anticorrosion layer is 75-95 weight % and
    wherein the second zinc-containing layer beside zinc further contains at least one element selected from the group consisting of aluminum, silicon, magnesium, and iron.

2. The method of claim 1, wherein a thickness of the first zinc-containing anticorrosion layer is between 0.1 µm and 50 µm.

3. The method of claim 1, wherein a thickness of the first zinc-containing anticorrosion layer is between 0.5 µm and 12 µm.

4. The method of claim 1, wherein a thickness of the second zinc-containing layer is between 1 µm and 12 µm.

* * * * *